(12) United States Patent
Tsukamoto et al.

(10) Patent No.: US 7,704,650 B2
(45) Date of Patent: Apr. 27, 2010

(54) DONOR SHEET, COLOR FILTER, ORGANIC EL ELEMENT AND METHOD FOR PRODUCING THEM

(75) Inventors: Yoji Tsukamoto, Sagamihara (JP); Masaru Iwasawa, Sagamihara (JP); Tatsuya Shimoda, Suwa (JP); Satoru Miyashita, Suwa (JP); Hiroshi Kiguchi, Suwa (JP)

(73) Assignees: 3M Innovative Properties Company, St. Paul, MN (US); Seiko Epson Corporation, Tokyo (JP)

( * ) Notice: Subject to any disclaimer, the term of this patent is extended or adjusted under 35 U.S.C. 154(b) by 118 days.

(21) Appl. No.: 11/860,387

(22) Filed: Sep. 24, 2007

(65) Prior Publication Data

US 2008/0026303 A1 Jan. 31, 2008

Related U.S. Application Data

(60) Division of application No. 11/020,664, filed on Dec. 22, 2004, now abandoned, which is a continuation of application No. 10/111,681, filed as application No. PCT/JP00/07599 on Oct. 27, 2000, now abandoned.

(30) Foreign Application Priority Data

Oct. 29, 1999 (JP) ................................. 11-308840

(51) Int. Cl.
*G02B 5/20* (2006.01)
(52) U.S. Cl. ........................... 430/7; 430/200; 347/106; 347/107
(58) Field of Classification Search ................ None
See application file for complete search history.

(56) References Cited

U.S. PATENT DOCUMENTS 5,521,035 A * 5/1996 Wolk et al. .................... 430/20

| 5,691,098 A | 11/1997 | Busman et al. |
| 5,747,217 A | 5/1998 | Zaklika et al. |
| 5,840,463 A | 11/1998 | Blanchet-Fincher |
| 6,766,817 B2 | 7/2004 | Da Silva |
| 6,766,918 B1 | 7/2004 | Bogdanovich |

FOREIGN PATENT DOCUMENTS

| EP | 0 851 714 | 7/1998 |
| EP | 0 880 303 | 11/1998 |
| JP | 4-161384 | 6/1992 |
| JP | 6-347637 | 12/1994 |
| JP | 7-35915 | 2/1995 |

(Continued)

OTHER PUBLICATIONS

Computer-generated translation of JP 8-292313 (Nov. 1996).*
Computer-generated translation of 6-347637 (Dec. 1994).*

*Primary Examiner*—John A. McPherson
(74) *Attorney, Agent, or Firm*—Merchant & Gould P.C.

(57) ABSTRACT

A donor sheet for transferring an image pattern to an image receiving element by a thermal imaging process using laser beam, comprising a base having formed in order on the base a light-to-heat conversion layer, and a transfer layer containing an image component which is melted by heating due to an action of the light-to-heat conversion layer and transferred to the image receiving element in a patterned form, in which the image component of the transfer layer contains an ink-repellent or solvent-repellent compound in an optimized amount. Using the donor sheet, it becomes possible to produce an separation member such as partition pattern and black matrix of a color filter by a shortened manufacturing step with ease and accuracy at high contrast, and can impart excellent ink repellency to the separation member.

4 Claims, 8 Drawing Sheets

FOREIGN PATENT DOCUMENTS

| | | |
|---|---|---|
| JP | 07/104113 | 4/1995 |
| JP | 8-282140 | 10/1996 |
| JP | 8-292313 * | 11/1996 |
| JP | 10/016395 | 1/1998 |
| JP | 10-123313 | 5/1998 |
| JP | 10/208881 | 8/1998 |
| JP | 10-309868 | 11/1998 |
| JP | 10-319230 | 12/1998 |
| JP | 10-332930 | 12/1998 |
| JP | 11-194211 | 7/1999 |
| JP | 2000-30871 | 1/2000 |
| WO | WO 96/01718 | 1/1996 |
| WO | WO 96/02010 | 1/1996 |
| WO | WO 96/06130 | 2/1996 |
| WO | WO 97/38865 | 10/1997 |
| WO | WO 98/24271 | 6/1998 |

* cited by examiner

DONOR SHEET, COLOR FILTER, ORGANIC EL ELEMENT AND METHOD FOR PRODUCING THEM

This application is a Divisional of application Ser. No. 11/020,664, filed Dec. 22, 2004, now abandoned, which is a Continuation of application Ser. No. 10/111,681, filed Apr. 25, 2002 now abandoned, and which applications are incorporated herein by reference.

TECHNICAL FIELD

The present invention relates to a thermal imaging process using laser beam and, more particularly, to a donor sheet (so-called "image forming sheet") used in the process, and an optical element formed by using the donor sheet, particularly, color filter and organic EL element and their production methods. Particularly, the present invention relates to a method of producing a separation rib of a color filter, a black matrix of a liquid crystal display device and a partitioning wall (bank) of an organic EL element. A thermal imaging process using laser beam is generally referred to as a laser beam thermal transfer method or LITI (Laser-induced Thermal Imaging) method.

BACKGROUND ART

As is well known, an ink-jet recording method is one method of printing methods and is utilized in various fields of image formation because multi-color fine images can be formed. For example, the ink-jet recording method is used for formation of a picture element area in the production of a separation rib (so-called "partition pattern") of a color filter and a black matrix of a liquid crystal display device.

For example, Japanese Unexamined Patent Publication (Kokai) No. 6-347637 discloses a method of printing a color pattern between the space of partition patterns (black matrix) containing fluorine-based water and oil repellency agents, characterized in that printing is conducted by using ink having a specific surface tension. In the case of this printing method, the partition pattern can be produced by known methods such as gravure printing method, photoresist method, thermal transfer method and the like. Japanese Unexamined Patent Publication (Kokai) No. 7-35915 discloses a color filter comprising a transparent substrate, a plurality of picture elements formed at a predetermined position of the transparent substrate, and a light shielding black matrix between the space of the picture elements, characterized in that the light shielding black matrix is a black resin layer containing a fluorine-containing compound and/or a silicon-containing compound. In the case of this color filter, the black matrix can be formed by using a black photosensitive resin composition as a starting material according to a photoresist method and the following formation of the picture elements can be conducted by a printing method or an ink-jet recording method.

The reason why the black matrix is formed from the black resin layer containing the fluorine-containing compound and/or silicon-containing compound in the above-described color filter is as follows. That is, when picture elements are formed by the ink-jet recording method, droplets of ink are ejected and dropped from a head of an ink-jet printer to an opening portion (picture element area) surrounded by the black matrix. In that case, ink having very low viscosity and small surface tension must be used so as to accurately eject small droplets of ink at high speed and to quickly spread them in a uniform thickness in the opening portion. Therefore, it becomes necessary to impart ink repellency (water repellency and oil repellency) to the black matrix itself for the purpose of preventing color mixture caused by leakage of ink from the black matrix. Suitable material includes the above-described fluorine-containing compound and silicon-containing compound.

By the way, a conventional method of forming a black matrix has several problems. For example, in case where the black matrix is formed from the above-described black photosensitive resin composition or a similar photosensitive composition prepared by dispersing black pigments, dyes or metal powders in a resin for the purpose of imparting a light shielding property according to a photoresist method, it is essential to conduct various treatments such as coating, curing, exposure, development, drying and the like of the resin composition. Therefore, not only the working is complicated, but also problems such as complexation of a processing device and increase in manufacturing cost occur. The black matrix is formed from a metal thin film, e.g. thin film of chromium (Cr) or chromium oxide ($CrO_2$) in place of the photosensitive resin composition. In this case, however, a photoresist method must be used for patterning the metal thin film and, therefore, the above-described problems can not be avoided.

Specifically explaining, the above-described black matrix is usually formed through a series of processing steps.

1) A black matrix precursor made of metal, i.e. a thin film of a black matrix forming material is formed on a substrate. For example, a thin film of Cr or a thin film of Cr and $CrO_2$ is formed by a sputtering method.

2) A photosensitive resin composition is coated on the thin film of the black matrix in a predetermined film thickness. Generally, a spin-coating method is used as a coating method.

3) The photosensitive resin composition is cured by prebaking in an oven to obtain a resist film.

4) The resist film is subjected to pattern exposure via a mask with a desired pattern of a black matrix. As an exposure light source, an ultraviolet lamp and the like is used.

5) The unexposed area of the resist film is removed, for example, by developing with an alkali developer.

6) Using, as a mask, the resist film remained without being removed, the exposed area of the underlying thin film of the black matrix precursor is removed by dissolving with an etching solution.

7) The residue on etching is removed by washing. As a result, a black matrix having a desired pattern is obtained.

8) The resist film used as the mask is removed.

Alternatively, the black matrix can also be formed by dispersing the light shielding material such as black pigment in the photosensitive resin composition. In this case, the black matrix precursor, i.e. metal thin film is not used and a glass substrate is used as the substrate. Accordingly, the steps (1) and (6) among the above-described processing steps are omitted and curing is conducted by post baking in place of removal of the resist in the step (8) and the cured resist is remained as it is.

As is understood from the above description, in the method of forming the black matrix by using a photoresist method, six to eight processing steps are generally required, whereby processing devices such as coating device of the resin composition, baking device, exposure device and the like are also required. A method of forming a black matrix of metal according to a deposition method, electroless plating method or the like without using a photoresist method is also considered, however, a problem about the processing step is remained and there is not a merit as compared with the photoresist method.

Under these circumstances, it is desired to provide a method of producing a black matrix, capable of directly forming the black matrix on a substrate without making processing steps and processing devices complex.

By the way, Japanese Unexamined Patent Publication (Kokai) No. 6-347637 cited above discloses a possibility of formation of a partition pattern according to a thermal transfer method, but it is not specifically described. Accordingly, a method of producing a color filter element using a LITI method described in U.S. Pat. No. 5,521,035 will be referred herein with regard to this respect. According to this method, a black matrix can be formed in a desired pattern by transferring a coloring agent from a black donor sheet containing a fluorine surfactant onto a substrate of a color filter element, utilizing thermal transfer due to laser beam. According to the black matrix using the LITL method, satisfactory results can be obtained as compared with a conventional photoresist method, but it is desired to further improve water repellency and oil repellency.

Further, the ink-jet recording method has been utilized in the formation of a luminescent layer made of an organic compound in the production of organic EL elements and devices. For example, International Publication WO98/24271 discloses a method of manufacturing an organic EL element, comprising the steps of: forming pixel electrodes on a transparent substrate; forming on said pixel electrodes by patterning at least one luminescent layer having a certain color and made of an organic compound; and forming a counter electrode opposing the pixel electrodes, wherein the formation of the luminescent layer is performed by means of an ink-jet method.

DISCLOSURE OF THE INVENTION

It is an object of the present invention to solve the above-described problems of the prior art and to provide a donor sheet, which can produce an separation member of an optical element, e.g. partition pattern and black matrix of a color filter, by a shortened manufacturing step with ease and accuracy at high contrast, and can impart excellent ink repellency, i.e. water repellency and oil repellency to the separation member.

It is another object of the present invention to provide a method of producing an separation member such as black matrix, partition pattern, etc., capable of directly forming the insulation member on a substrate using the donor sheet of the present invention without making processing steps and processing devices complex.

It is still another object of the present invention to provide a color filter provided with the separation member formed using the donor sheet of the present invention.

It is a further object of the present invention to provide a method of producing the color filter provided with the separation member formed using the donor sheet of the present invention.

It is a still another object of the present invention to provide an organic EL element having partitioning walls formed upon use of the donor sheet of the present invention, and a production method thereof.

The above-described objects as well as other objects will become apparent from the following detailed description.

The present invention provides, in an aspect thereof, a donor sheet for transferring an image pattern to an image receiving element by a thermal imaging process using laser beam, comprising a base, a light-to-heat conversion layer, and a transfer layer containing an image component which is molten by heating due to an action of the light-to-heat conversion layer and transferred to the image receiving element in a patterned form, said layers being formed in order on the base, characterized in that:

the image component of the transfer layer contains an ink-repellent or solvent-repellent compound in an optimized amount.

In the donor sheet of the present invention, it is preferred that an intermediate layer is disposed between the light-to-heat conversion layer and the transfer layer. Further, it is preferred that the transfer layer contains an fluorine-containing compound or a silicone compound alone or in combination.

The present invention provides, in another aspect thereof, a color filter comprising a transparent substrate, a plurality of picture elements disposed on a predetermined position of the substrate, and a partition pattern for separating adjacent picture elements, characterized in that:

the partition pattern on the substrate is formed by making the transfer layer of the donor sheet of the present invention and the surface of the substrate come closely into contact with each other and transferring the image component of the transfer layer of the donor sheet in a pattern corresponding to the partition pattern by a thermal imaging process using laser beam.

In the color filter of the present invention, the picture elements are preferably formed by forming the partition pattern and applying ink to a picture element forming area using an ink-jet system.

In the color filter of the present invention, the partition pattern can function as a separation rib of the color filter, or the partition pattern itself has a light shielding property in a predetermined level and functions as a black matrix of a liquid crystal display device.

The present invention provides, in a still another aspect, a method of producing a color filter comprising a transparent substrate, a plurality of picture elements disposed on a predetermined position of the substrate, and a partition pattern for separating adjacent picture elements, which comprises the steps of:

coating the surface of the substrate to form a thin film of a black matrix forming material;

laying the substrate and a donor sheet of the present invention one upon another so that the thin film-like black matrix forming material and the transfer layer of the donor sheet come closely into contact with each other;

irradiating laser beam from the base side of the donor sheet corresponding to a desired pattern of the black matrix by a thermal image process using laser beam, thereby to melt the image component of the transfer layer of the donor sheet with heating and to transfer the melted image component on the thin film-like black matrix forming material;

removing the exposed black matrix forming material by etching using, as a mask, the image component transferred to the surface of the thin film-like black matrix forming material of the substrate in a patterned form; and filling an opening portion surrounded by the partition pattern formed from the image component and black matrix as a ground thereof with ink having a predetermined color using an ink-jet method, thereby to form picture elements.

The present invention also provide a method of producing a color filter comprising a transparent substrate, a plurality of picture elements disposed on a predetermined position of the substrate, and a partition pattern for separating adjacent picture elements, which comprises the steps of:

forming a thin film-like black matrix in a predetermined pattern on the surface of the substrate;

making the surface of the black matrix side of the substrate and a transfer layer of a donor sheet of the present invention come closely into contact with each other;

irradiating laser beam from the base side of the donor sheet corresponding to the pattern of the black matrix by a thermal image process using laser beam, thereby to melt the image component of the transfer layer of the donor sheet with heating and to pile up the melted image component on the black matrix; and filling an opening portion surrounded by the formed partition pattern with ink having a predetermined color using an ink-jet method.

Furthermore, the present invention provides a method of producing a color filter comprising a transparent substrate, a plurality of picture elements disposed on a predetermined position of the substrate, and a light shielding partition pattern for separating adjacent picture elements, which comprises the steps of:

laying the substrate and a donor sheet of the present invention one upon another so that the thin surface of the substrate and the transfer layer of the donor sheet come closely into contact with each other;

irradiating laser beam from the base side of the donor sheet corresponding to a desired pattern of the black matrix by a thermal image process using laser beam, thereby to melt the image component of the transfer layer of the donor sheet with heating and to transfer the melted image component on the substrate; and filling an opening portion surrounded by the light shielding partition pattern formed from the image component with ink having a predetermined color using an ink-jet method, thereby to form picture elements.

Further, the present invention provides an organic EL element comprising a transparent substrate, a plurality of pixel electrodes disposed on a predetermined position of the substrate, a partition pattern for separating adjacent pixel electrodes, at least one luminescent layer formed on the pixel electrodes, and a counter electrode formed on the luminescent layer, characterized in that:

the partition pattern on the substrate is formed by making the transfer layer of the donor sheet of the present invention and the surface of the substrate come closely into contact with each other and transferring the image component of the transfer layer of the donor sheet in a pattern corresponding to the partition pattern by a thermal imaging process using laser beam.

The present invention also provides a method of producing an organic EL element comprising a transparent substrate, a plurality of pixel electrodes disposed on a predetermined position of the substrate, a partition pattern for separating adjacent pixel electrodes, at least one luminescent layer formed on the pixel electrodes, and a counter electrode formed on the luminescent layer, which comprises the steps of:

forming pixel electrodes in a predetermined pattern on the surface of the substrate;

making the surface of the pixel electrodes side of the substrate and a transfer layer of a donor sheet comprising a base, a light-to-heat conversion layer, and the transfer layer containing an image component which is molten by heating due to an action of the light-to-heat conversion layer and transferred to the substrate in a patterned form, said layers being formed in order on the base, come closely into contact with each other;

irradiating laser beam from the base side of the donor sheet corresponding to the partition pattern by a thermal image process using laser beam, thereby to melt the image component of the transfer layer of the donor sheet with heating and to pile up the molten image component on the substrate; and filling an opening portion surrounded by the formed partition pattern with an organic material having a predetermined color using an ink-jet method to form the luminescent layer.

BEST MODE FOR CARRYING OUT THE INVENTION

Figure 1:
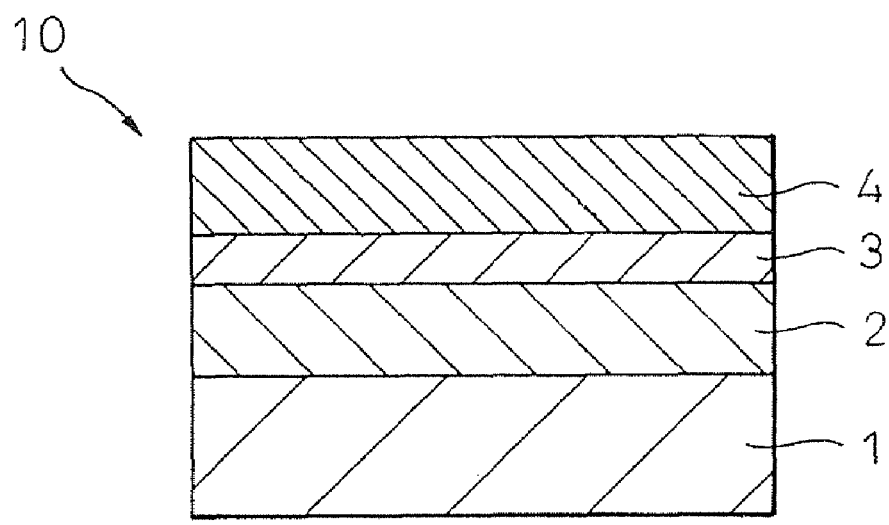
FIG. 1 is a schematic sectional view showing a typical construction of a donor sheet according to the present invention.

Subsequently, the embodiments of the present invention will be described with reference to the accompanying drawings. In the description with reference to the following drawings, different part names are sometimes applied to those of the same reference numerals for convenience's sake.

The donor sheet according to the present invention is used as an image forming element so as to transfer an image pattern to an image receiving element by a thermal imaging process (LITI method). FIG. 1 shows a typical construction of a donor sheet of the present invention. As shown in the drawing, a donor sheet 10 comprises a base 1, being formed in order on the base 1, a light-to-heat conversion layer 2, an intermediate layer 3 and a transfer layer 4 containing an image component which is molten by heating due to an action of the light-to-heat conversion layer 2 and transferred to an image receiving element (not shown) in a patterned form. The donor sheet of the present invention may also have any additional layer, if necessary.

In the donor sheet according to the present invention, the base can be formed from various natural or synthetic materials as far as the material can meet the requirements to the donor sheet. The requirements to this base include, for example, transmittance of laser beam and heat resistance (because heating is conducted by irradiation of laser beam to transfer the image component), and proper flexibility, lightness, handling property and mechanical strength (because the donor sheet is used by applying to the image receiving element and then peeled off after use). Suitable base includes various plastic materials such as polyester resin and the like.

The thickness of the base can vary depending on details of the desired donor sheet and is usually within a range from about 0.01 to 2.54 mm.

The light-to-heat conversion layer (also referred to as LTHC layer) supported by the base has a function of converting optical energy from laser beam irradiation into thermal energy, thereby to melt an image component in a transfer layer adjacent to the light-to-heat conversion layer via an intermediate layer and to transfer and adhere the melted image component to the surface of the image receiving element. Accordingly, the light-to-heat conversion layer is preferably made of a light absorbing material itself, such as carbon black, or made of a layer containing the light absorbing material dispersed therein. Furthermore, this light-to-heat conversion layer preferably contains a photopolymerizable component for the purpose of curing. Suitable light-to-heat conversion layer is, for example, a layer wherein a photopolymerizable monomer or oligomer and a photopolymerization initiator are dispersed in a binder resin. Such a light-to-heat conversion layer can be usually formed, for example, by coating a resin composition having a predetermined composition on the surface of a base according to a conventional coating method such as spin-coating method, gravure printing method, die coating method or the like, and drying the resin composition. The thickness of the light-to-heat conversion layer can vary depending on details and effect of the desired donor sheet and is usually within a range from about 0.001 to 10 μm.

The intermediate layer existing between the light-to-heat conversion layer and transfer layer has a function of enabling a uniform light-to-heat conversion action of the light-to-heat conversion layer. Usually, the intermediate layer can be formed from a resin material capable of meeting the above-described requirements. Such an intermediate layer can be usually formed, for example, by coating a resin composition having a predetermined composition on the surface of the light-to-heat conversion layer according to a conventional coating method such as spin-coating method, gravure printing method, die coating method or the like, and drying the resin composition in the same manner as in the case of the light-to-heat conversion layer. The thickness of the intermediate layer can vary depending on details and effect of the desired donor sheet and is usually within a range from about 0.05 to 10 μm.

The transfer layer to be disposed as an outermost layer of the donor sheet of the present invention contains an image component which is molten by heating due to an action of the light-to-heat conversion layer and transferred to the image receiving element in a patterned form, as described above. Accordingly, the transfer layer plays a very important role in the donor sheet of the present invention. As described in detail hereinafter, the image component of the transfer layer must contain a fluorine-containing compound and/or a silicone compound in an optimized amount for the purpose of accomplishing excellent controlled ink repellency, in addition to the component concerned directly to image formation, i.e. component which is transferred to the image receiving element and constitutes its separation member.

The transfer layer can transfer the image component contained therein to the surface of the image receiving element at high contrast according to the LITI method and adhere it as a transferred image pattern, and can be formed in any composition as far as any peel residue is not formed when the used donor sheet is peeled from the image receiving element. According to use of the image pattern to be formed from the image component, the composition suited for each use can be prepared. In case where the image pattern is used as a separation member, i.e. separation rib or partition pattern, on the black matrix of the liquid crystal display device, or case where the image pattern is used both as the black matrix and separation rib after imparting the light shielding property to the image pattern, the composition of the transfer layer can be changed considering the light shielding property. To improve the light shielding property, a black pigment (e.g. carbon black, etc.) and other coloring pigments may be added in the enhanced amount or metal powders may be added.

In any case, according to the present invention, the water repellency and oil repellency in high level can be imparted to the transferred image pattern and the adhesion of the image pattern to the surface of the image receiving element is good. That is, in the transfer layer of the present invention, a fluorine-containing compound, a silicone compound or a mixture thereof as a ink repellent component is contained in the image component and, at the same time, the content of the ink repellent component is controlled within an optimum range. When the content of the ink repellent component is too large, the adhesion to the base is lowered. On the other hand, when the content is too small, sufficient water repellency and oil repellency can not be obtained.

Thus, according to the present invention, a colored image pattern with excellent water repellency and oil repellency can be formed without impairing the image receiving element or its adhesion to the base when the transfer layer is a colored ink layer containing a colored image component. In case where such a colored image pattern is formed on the base and then another colored image pattern is formed from water-based or oil-based ink at the area other than that of the colored image pattern using a conventional technique such as printing method, ink-jet recording method, brushing method or the like, two colored image patterns can be separately formed, effectively, thereby making it possible to effectively prevent defects such as color mixture, unevenness of thickness or the like. In case where three-color or multi-color colored image pattern is formed according to the same technique as described above, an initial colored image pattern derived from the transfer layer can also be utilized as a partition pattern or separation rib for separating the other colored image pattern (e.g. second and third colored image patterns).

In the present invention, various fluorine-containing compounds as the ink repellent component can be contained in the image component so as to obtain the above-described functions and effects. Suitable fluorine-containing compound includes, but are not limited to, monomer, oligomer or polymer containing fluorine atoms in the molecule, fluorine-containing surfactant or the like. These fluorine-containing compounds are preferably those which are compatible with or dispersed in a binder resin used as a portion of the image component in the transfer layer, e.g. acrylic resin or the like.

The amount of the above-described fluorine-containing compound to be added to the image component can vary widely depending on the kind of the compound, but is preferably optimized according to a surface tension of ink used for formation of the colored image pattern. Specifically, the amount is preferably within a range of not more than 10% by weight, based on the total amount of the image component.

In the practice of the present invention, the same amount of a silicone compound can be used in place of the above-described fluorine-containing compound or used in combination with it. Suitable silicone compound includes, but are not limited to, resins, rubbers, surfactants, coupling agents and the like which are based on an organic polysiloxane.

In the present invention, it is necessary to ensure the ink repellency enhanced in the resulting transferred image pattern, i.e. water repellency and oil repellency. The term "ink repellency" used herein has almost the same meaning as that of "water repellency" defined in Japanese Unexamined Patent Publication (Kokai) No. 6-347637. That is, the "ink repellency" is defined by a relation between the surface tension of the surface of the substrate of the image receiving element to which image pattern is transferred, that of ink and that of the partition pattern (e.g. black matrix, etc.). In the present invention, the following matters are required to obtain enhanced ink repellency:

(1) The following relationship:
Critical surface tension of the surface of substrate>Surface tension of ink>Critical surface tension of partition pattern shall be satisfied;

(2) The critical surface tension of the partition pattern should be smaller than 35 dyne/cm;

(3) The critical surface tension of the surface of the substrate should be 35 dyne/cm or more; and (4) Comparing the surface tension of ink with that of the partition pattern or that of the surface of the substrate, a difference should be 5 dyne or more.

The ink repellency required in the present invention can be defined from another point of view. Preferably, the ink repellency can be defined by a contact angle of the surface of the substrate with ink ejected from a head of an ink-jet printer. When using solvent-based ink whose surface tension is from 20 to 40 mN/m, the contact angle with ink is preferably within a range from 30 to 55°, and more preferably from 40 to 50°. When using water-based ink having a surface tension of 40 to 55 mN/m, the contact angle with ink is preferably within a range from 60 to 80°. When the contact angle with ink to be used is smaller than the above-described range, color mixture with the other color in adjacent picture element area occurs and, therefore, a desired color filter can not be produced. On the other hand, when the contact angle with ink to be used is larger than the above-described range, color mixture with the other color in adjacent picture element area does not occur. However, ink retained in the picture element area comes into a state where the center portion is exclusively protuberant (concave state) and, therefore, the picture element center portion is protuberant as compared with the peripheral portion even after drying ink, resulting in color spot.

Figure 2A:
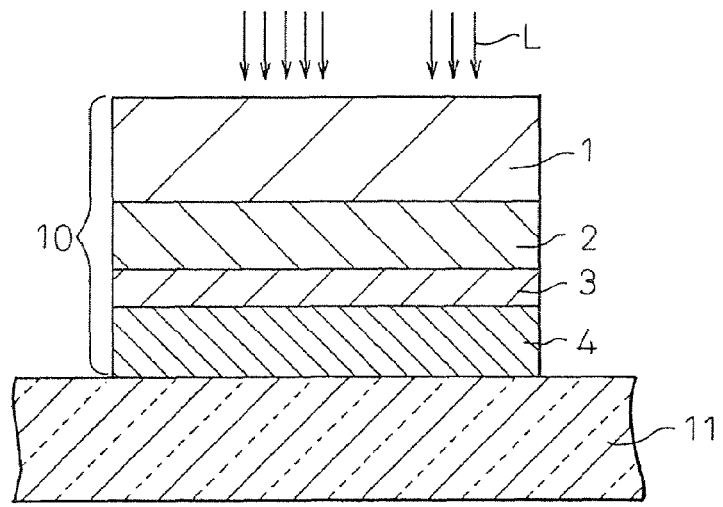
FIGS. 2A to 2C are a series of sectional views showing in sequence a mechanism of transfer of an image pattern to an image receiving element in the donor sheet of FIG. 1.
Figure 2B:
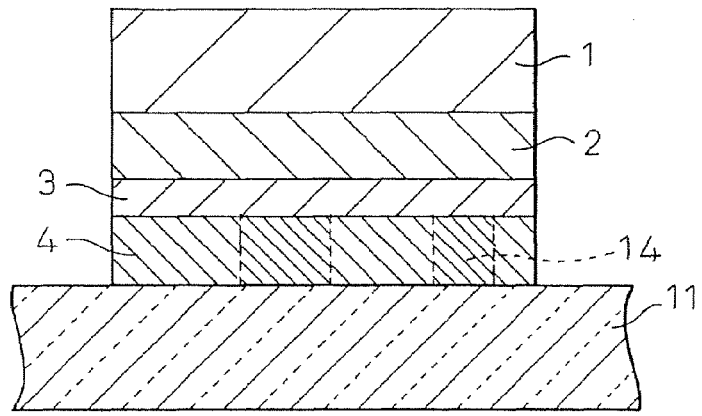
Figure 2C:
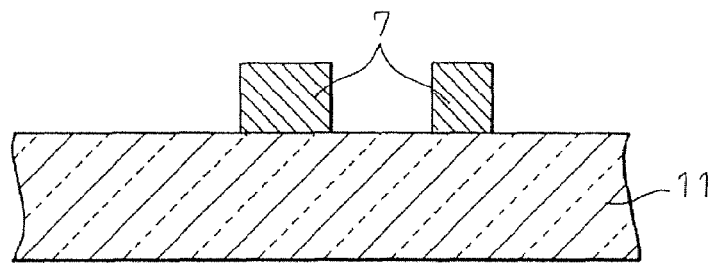

A mechanism of transfer of the image component in the donor sheet of the present invention will be apparent from FIGS. 2A to 2C. FIGS. 2A to 2C are a series of sectional views showing in sequence a mechanism of transfer of an image pattern to an image receiving element in the donor sheet of FIG. 1.

As shown in FIG. 2A, a donor sheet 10 having the same construction as that of the donor sheet shown in FIG. 1 are prepared, and then this donor sheet and a substrate 11 are laid one upon another so that a transfer layer 4 and the substrate 11 as an image receiving element come closely into contact with each other. Then, the donor sheet 10 of the resulting laminate is irradiated with laser beam L from the side of the base 1 in a predetermined pattern. The pattern of laser beam L corresponds to an image pattern to be transferred to the image receiving element.

As a result of pattern irradiation of laser beam, optical energy is converted into thermal energy by an action of a light-to-heat conversion layer 2 adjacent to the base 1 of the donor sheet 10 and the resulting thermal energy is further evened by an action of an intermediate layer 3. Therefore, as shown in FIG. 2B, an image component 14 contained in the transfer layer 4 is molten by heating in a patterned form, and then transferred and adhered to the substrate 11 as the image receiving element.

FIG. 2C shows a transferred image pattern 7 formed on the substrate 11 as described above. This image pattern 7 is made closely into contact with the substrate through a strong force. Since this image pattern 7 has sufficiently high ink repellency, oozing of ink to the other area or color mixture with the color of adjacent area can be prevented in case where ink is adhered to the non-image pattern area using an ink-jet recording method. Accordingly, when using such a donor sheet, color mixture or unevenness of thickness of color stripe can be effectively prevented in the production of the color filter using the ink-jet recording method.

Also, the present invention is directed to a color filter comprising a transparent substrate, a plurality of picture elements disposed at a predetermined position on the substrate, and a partition pattern for separating adjacent picture elements. In such a color filter, the partition pattern for separating adjacent picture elements (e.g. separation rib or black matrix) can be formed by making the transfer layer of the donor sheet of the present invention and the surface of the substrate come closely into contact with each other using the donor sheet of the present invention according to the above-described technique, and transferring the image component of the transfer layer of the donor sheet in a pattern corresponding to the partition pattern by a thermal imaging process using laser beam.

Figure 3:
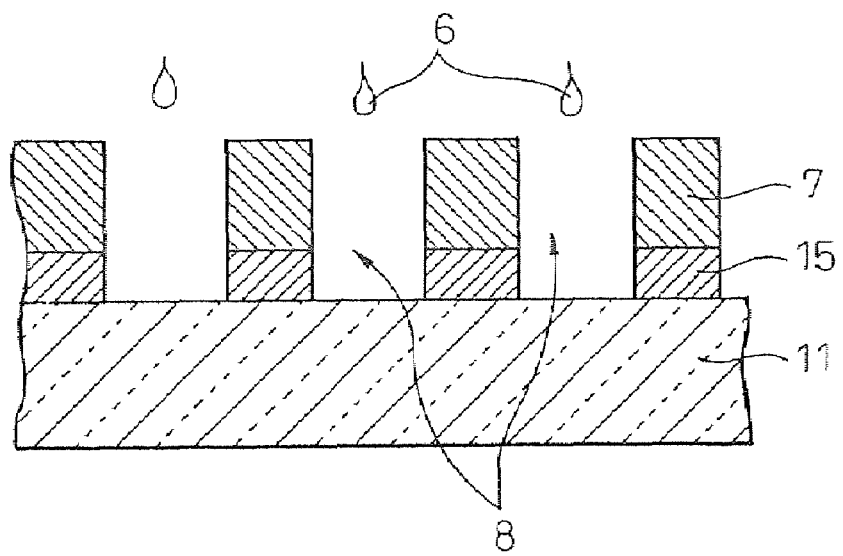
FIG. 3 is a sectional view showing one embodiment of a separation rib of a color filter of the present invention formed by using the donor sheet of FIG. 1.

FIG. 3 is a sectional view showing one embodiment of a separation rib of a color filter of the present invention formed by using the donor sheet of FIG. 1. As shown in the drawing, a partition pattern composed of a black matrix 15 and a separation rib 7 is formed at a predetermined area (partition pattern area) of a substrate 11. Picture elements can be formed by applying ink 6 to a picture element area 8 by an ink-jet printing method after forming the partition pattern.

Figure 4:
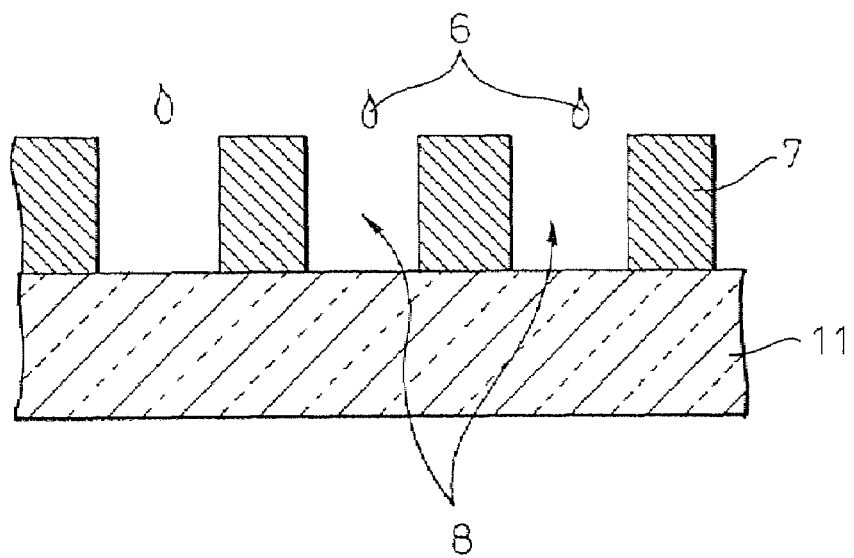
FIG. 4 is a sectional view showing one embodiment of a black matrix of a liquid crystal display device of the present invention formed by using the donor sheet of FIG. 1.

FIG. 4 shows one modification of FIG. 3 and is a sectional view showing one embodiment of a black matrix of a liquid crystal display device of the present invention formed by using the donor sheet of FIG. 1. As is shown in the drawing, the black matrix 15 is omitted and thus the separation 7 can also serve as a black matrix.

The color filters shown in FIGS. 3 and 4 can be preferably produced by the steps shown in order in FIGS. 5A to 5E, 6A to 6D and 7A to 7D. It will be appreciated that the embodiments shown in the drawings are illustrative and various modifications and improvements may be made within the scope of the present invention.

FIGS. 5A to 5D are a series of sectional views showing in sequence a method of producing the separation rib of FIG. 3 according to the present invention.

Figure 5A:
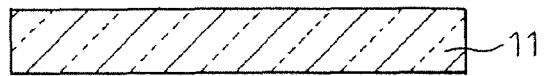
FIGS. 5A to 5E are a series of sectional views showing in sequence a method of producing the separation rib of FIG. 3 according to the present invention.

As shown in FIG. 5A, a transparent substrate 11 suited for production of a color filter is provided. Suitable substrate includes various glass substrates used conventionally in this technical field, but a transparent plastic substrate can also be used, if necessary.

Figure 5B:
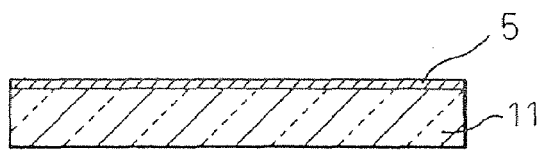

Then, the surface of the provided substrate 11 is coated with a thin film of a black matrix forming material, as shown in FIG. 5B. The usable black matrix forming material includes, for example, metal or oxide thereof, such as chromium (Cr), chromium oxide ($CrO_2$) or the like. The thin film of the black matrix forming material can be formed in a predetermined film thickness by using various film forming methods including sputtering method, deposition method and the like. This thin film may be a single layer or a multi-layer of two or more layers. The thickness of the black matrix forming material can vary widely, but is preferably within a range from 0.01 to 1 μm, and more preferably from 0.1 to 0.25 μm. In such way, a thin film 5 as a black matrix precursor is formed on the substrate 11.

Figure 5C:
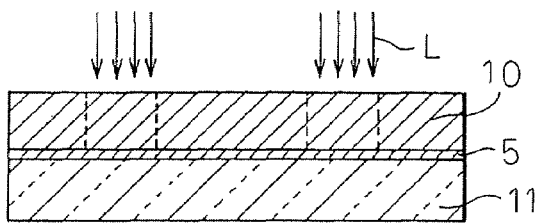

As shown in FIG. 5C, the donor sheet 10 of the present invention is placed on the substrate 11 via the thin film 5, and then they are laid on upon another so that the thin film-like black matrix forming material 5 and a transfer layer (not shown) of the donor sheet 10 come closely into contact with each other.

Laser beam L is irradiated from the substrate side of the donor sheet 10 in a pattern corresponding to a desired pattern of the black matrix by a thermal imaging process using laser beam, and then an image component of the transfer layer of the donor sheet 10 is molten by heating and transferred onto the thin film-like black matrix forming material 5.

Figure 5D:
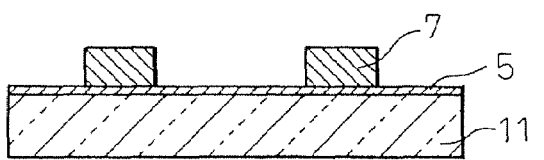

As shown in FIG. 5D, there can be obtained an image component 7 transferred on the surface of the thin film-like black matrix forming material 5 of the substrate 11 in a patterned form. A matrix-like pattern of the image component 7 serves as a separation rib in the finally obtained color filter and its thickness can vary widely depending on the desired effect, but is preferably within a range from 0.5 to 3.0 μm, and more preferably from 1.5 to 2.5 μm. The thickness of less than 0.5 μm does not ensure a height of separation rib sufficient to receive ink, whereas the thickness of more than 3.0 μm causes a reduction of flatness of the color filter produced upon drying of filter.

Using the matrix-like pattern of the image component 7 as a mask, the exposed thin film-like black matrix forming material 5 is removed by etching. As an etchant, various acids can be used or a dry etching may also be used, if necessary. The residue, which was not removed by etching, can be completely removed by a treatment such as washing or the like.

Figure 5E:
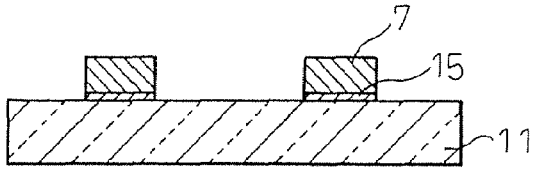

As a result of the etching, as shown in FIG. 5E, there can be obtained a substrate 11 having a partition pattern composed of a black matrix 15 and a separation rib 7. The separation rib 7 used as the mask for formation of the black matrix 15 may also be removed by alkaline solution washing or any other peeling techniques.

Subsequently, although not shown in the drawing, an opening portion surrounded by a partition pattern formed of a separation rib and a black matrix forming material as a ground (this portion is referred to as a picture element area) is preferably filled with ink having a predetermined color by an ink-jet recording method, thereby to form picture elements (see FIG. 3).

A color filter comprising a transparent substrate, a plurality of picture elements disposed on a predetermined position of the substrate, and a partition pattern for separating adjacent picture elements, as the color filter of the present invention, is obtained through processing steps whose number is smaller than that of a conventional method, using a simplified processing device. Since the separation rib 7 is superior in ink repellency in this color filter, oozing of ink to the other area or color mixture with the color of adjacent area can be prevented in case where picture elements are formed by filling the picture element area with ink using an ink-jet recording method.

FIGS. 6A to 6D are a series of sectional views showing in sequence another method of producing the separation rib of FIG. 3 according to the present invention. The method shown in the drawing can be carried out basically in the same manner as that shown in FIGS. 5A to 5E described previously, except for changing the procedure of the treatment.

Figure 6A:
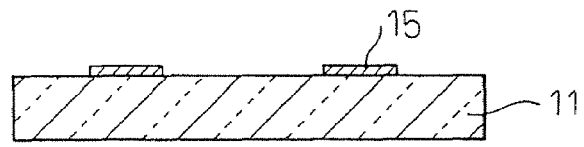
FIGS. 6A to 6D are a series of sectional views showing in sequence another method of producing the separation rib of FIG. 3 according to the present invention.

First, as shown in FIG. 6A, a thin film-like black matrix 15 is formed on the surface of a prepared transparent substrate 11 in a predetermined pattern. The black matrix 15 can be formed by depositing Cr in a form of a thin film using a sputtering method.

Figure 6B:
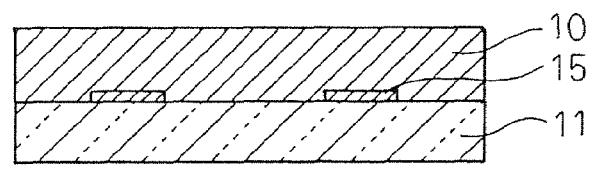
Figure 6C:
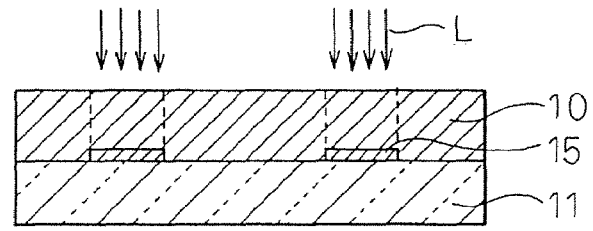

Then, as shown in FIG. 6B, the surface of the black matrix 15 of the substrate 11 and a transfer layer (not shown) of the donor sheet of the present invention are made come closely into contact with each other. Furthermore, as shown in FIG. 6C, laser beam L is irradiated from the substrate side of the donor sheet 10 in a pattern corresponding to the pattern of the black matrix 15 by a thermal imaging process using laser beam.

Figure 6D:
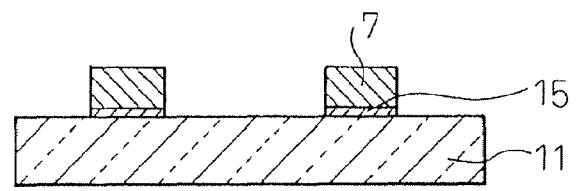

As a result of pattern irradiation of laser beam, the image component of the transfer layer of the donor sheet 10 can be melted by heating and then piled up as a separation rib 7 on the black matrix 15, as shown in FIG. 6D. As a result, a partition pattern composed of the black matrix 15 and the separation rib 7 disposed thereon is obtained.

Subsequently, as described previously with reference to FIG. 3, picture elements are formed by filling an opening portion (picture element area) surrounded by the formed partition pattern with ink having a predetermined color using an ink-jet method. Therefore, a color filter comprising a transparent substrate, a plurality of picture elements disposed on a predetermined position of the substrate, and a partition pattern for separating adjacent picture elements can be obtained.

FIGS. 7A to 7D are a series of sectional views showing in sequence a method of producing the black matrix of FIG. 4 according to the present invention. This method can also be carried out basically in the same manner as those shown in FIGS. 5A to 5E and 6A to 6D described previously. In the case of this method, since the separation rib can also act as the black matrix, it is essential that the composition of the image component of the transfer layer is determined so that the transfer layer can provide a separation rib superior in light shielding property. This description was stated previously in the item of the donor sheet.

Figure 7A:
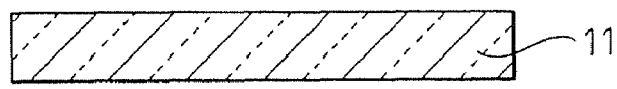
FIGS. 7A to 7D are a series of sectional views showing in sequence a method of producing the black matrix of FIG. 4 according to the present invention in order.
Figure 7B:
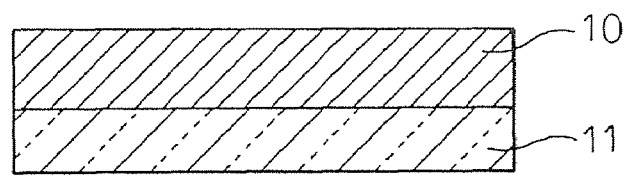

First, a transparent substrate 11 as shown in FIG. 7A is prepared, and the substrate and donor sheet 10 of the present invention are laid one upon another as shown in FIG. 7B. In this case, attention is paid so that the surface of the substrate 11 and the transfer layer (not shown) of the donor sheet 10 come closely into contact each other.

Figure 7C:
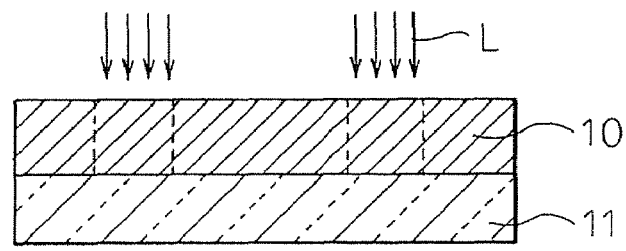
Figure 7D:
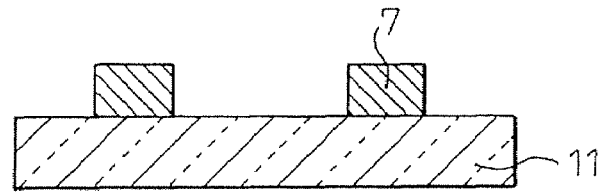

Then, a thermal imaging process using laser beam is carried out. This process is carried out by irradiating laser beam L from the substrate side of the donor sheet 10 in a pattern corresponding to a desired pattern of the black matrix, as shown in FIG. 7C. As a result of pattern irradiation of laser beam, the image component of the transfer layer of the donor sheet 10 can be melted by heating and then transferred onto the substrate. As shown in FIG. 7D, a light shielding partition pattern 7 serving both as the black matrix and separation rib is formed.

Subsequently, although not shown, picture elements are formed by filling an opening portion (picture element area) surrounded by the light shielding partition pattern formed from the image component with ink having a predetermined color using an ink-jet method (see FIG. 4).

As a result, a color filter having excellent characteristics, comprising a transparent substrate, a plurality of picture elements disposed on a predetermined position of the substrate, and a partition pattern for separating adjacent picture elements, can be obtained by a very simple technique using a simplified processing device.

According to the present invention, organic EL elements or devices and other optical devices can be advantageously produced, in addition to the production of the color filters. As described above, the organic EL element of the present invention comprises a transparent substrate, a plurality of pixel electrodes disposed on a predetermined position of the substrate, a partition pattern for separating adjacent pixel electrodes, at least one luminescent layer formed on the pixel electrodes, and a counter electrode formed on the luminescent layer, and is characterized in that the partition pattern on the substrate is formed by making the transfer layer of the donor sheet of the present invention and the surface of the substrate come closely into contact with each other and transferring the image component of the transfer layer of the donor sheet in a pattern corresponding to the partition pattern by a thermal imaging process using laser beam. In the organic EL element of the present invention, the luminescent layer is preferably formed by forming the partition pattern, followed by applying an organic material to a luminescent layer-forming area using an ink-jet system.

The organic EL element having partition pattern, i.e., partitioning wall (bank), according to the present invention may have a wide variety of embodiments or structures, and accordingly they can be produced in accordance with the different methods.

FIGS. 8A to 8G illustrate one embodiment of the organic EL element of the present invention, along with a production process thereof. The organic EL element of the present invention will be described hereinafter referring to the illustrated element, to which the present invention should not be restricted.

The illustrated organic EL element is a full color organic EL element with three colors, and, as is illustrated, it can be produced by the step (FIG. 8A) of forming pixel electrodes 21, 22 and 23 or a transparent substrate 24, the step (FIG. 8B) of conducting a LITI method using donor sheet 10 of the present invention, the step (FIG. 8C) of forming partitioning walls (banks) 25, the step (FIG. 8D) of patterning luminescent layers 26 and 27, made of an organic compound, on the respective pixel electrodes, the step (FIG. 8E) of forming a luminescent layer 28, and the step (FIG. 8F) of forming a cathode 31. The formation of the luminescent layer 26 and 27 can be carried out by means of an ink-jet method.

The transparent substrate 24 functions not only as a support but also as a surface through which light is taken out. Accordingly, the material for the transparent substrate 24 is selected by taking the light-permeability, thermal stability and the like into consideration. As for examples of the material to be used for the transparent substrate, glass, transparent plastic or the like can be mentioned, and among these materials, a substrate made of glass is particularly preferable in view of its excellent heat resistance.

Figure 8A:
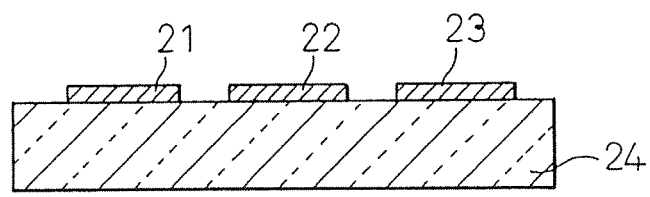
FIGS. 8A to 8G are a series of sectional views showing in sequence a method of producing an organic EL element using a donor sheet of the present invention.
Figure 8B:
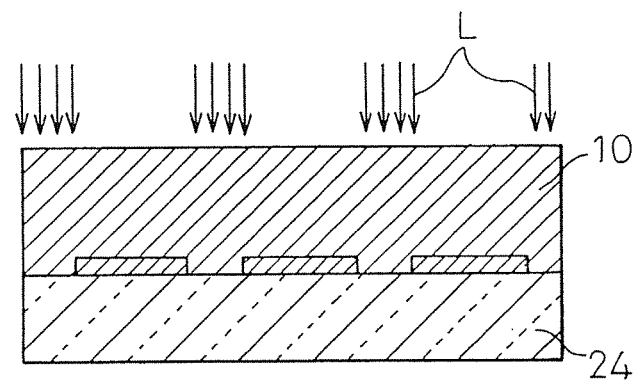

As is shown in FIG. 8A, first, pixel electrodes 21, 22 and 23 are formed on the transparent substrate 24. As for examples of methods of forming these pixel electrodes, photolithography, vacuum deposition method, sputtering method and pyrosol method can be mentioned. Among these methods, the photolithography is particularly preferable. As for these pixel electrodes, it is preferred that they are formed into transparent pixel electrodes. As for the materials constituting the transparent pixel electrodes, a tin oxide film, an ITO film and a composite oxide film of indium oxide and zinc oxide can be mentioned.

Figure 8C:
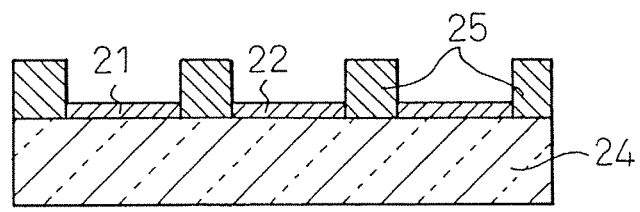

Next, as shown in FIG. 8C partitioning walls (banks) 25 are formed to fill the spaces between the pixel electrodes. In this way, it is possible to improve the contrast, to prevent mixing of colors of the luminescent materials, and to prevent light from leaking between the pixels.

The formation of the partitioning walls 25 can be carried out in accordance with the LITI method which was applied to the formation of the partition pattern in the above-described production of the color filter. That is, as is shown in FIG. 8C, a donor sheet 10 having the same construction as that of the donor sheet shown in FIG. 1 are prepared, and then this donor sheet and a transparent substrate 24 are laid one upon another so that a transfer layer and the substrate come closely into contact with each other. Then, the donor sheet 10 of the resulting laminate is irradiated with laser beam L from the side of the base of the donor sheet in a predetermined pattern. The pattern of laser beam L corresponds to a pattern of the partitioning walls 25 to be transferred to the transparent substrate 24.

As a result of pattern irradiation of laser beam, optical energy is converted into thermal energy by an action of a light-to-heat conversion layer adjacent to the base of the donor sheet 10 and the resulting thermal energy is further evened by an action of an intermediate layer. Therefore, an image component contained in the transfer layer is melted by heating in a patterned form, and then transferred and adhered to the substrate 24. FIG. 8C shows a transferred pattern of the partitioning walls 25 formed on the substrate 24. This pattern of the partitioning walls 25 is made closely into contact with the substrate 24 through a strong force. Since this pattern has sufficiently high ink repellency, oozing of ink to the other area or color mixture with the color of adjacent area can be prevented in case where ink is adhered to the non-image pattern area using an ink-jet recording method. Color mixture or unevenness of thickness of color stripe can be effectively prevented in the production of the color filter using the ink-jet recording method.

As for the materials constituting the banks 25, no particular limitation is imposed, if they have a resistance to the solvent for the EL material. For example, organic material such as acrylic resin, epoxy resin, photosensitive polyimide and the like; and inorganic material such as liquid glass and the like can be mentioned. In this regard, it is to be noted that the banks 25 may be formed into a black resist which is formed by mixing carbon black and the like into the above-mentioned material. Of course, it is necessary that these materials satisfy the requirements for the donor sheet of the present invention.

Further, organic luminescent layers are formed respectively on the pixel electrodes according to a predetermined pattern. In this case, it is preferable to provide organic luminescent layers with three color types. In this connection, it is preferred that at least one layer among these organic luminescent layers is formed by an ink-jet method.

Figure 8D:
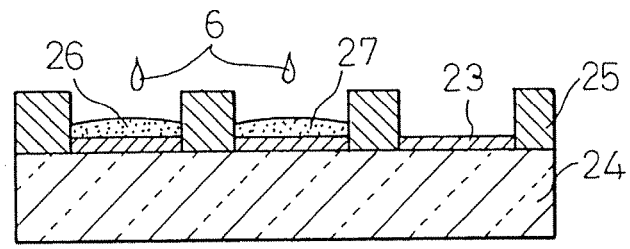

In the illustrated embodiment, a red luminescent layer 26 and a green luminescent layer 27 are formed on the pixel electrodes 21 and 22, respectively, by the ink-jet method. That is, as is shown in FIG. 8D, a pixel of one of the three primary colors including red, green and blue or a pixel of at least one color which is intermediate between the primary colors is formed by dissolving or dispersing a droplet 6 of the luminescent material in a solvent to obtain a discharge liquid and then discharging a droplet 6 of the discharge liquid from a head of an ink-jet device (not shown).

According to such an ink-jet method, it is possible to carry out fine patterning in a simple manner and in a short time. Further, it is also possible to control easily and freely the luminescent characteristics such as color balance and brightness (luminance) by adjusting the thickness of the layer through adjustment of the discharge amount of the ink or by adjusting the ink concentration.

When the organic luminescent materials are conjugated polymer precursors, the luminescent layers are formed by discharging the luminescent materials by the ink-jet method to carry out patterning, and then conjugating (to form a film) the precursor components by heating or irradiation with light or the like.

Figure 8E:
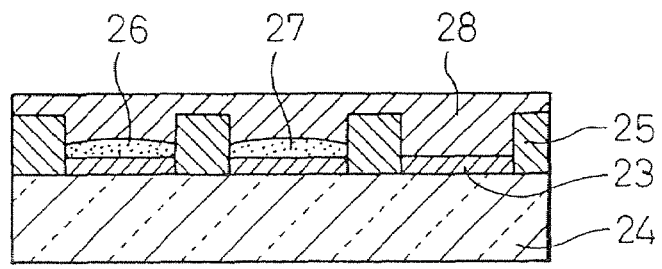

Next, as shown in FIG. 8E, a blue luminescent layer 28 is formed on the red luminescent layer 26, the green luminescent layer 27 and the pixel electrode 23. In this way, it is possible not only to form layers having the three primary colors including red, green and blue, but also to bury the level differences between the banks 25 and each of the red luminescent layer 26 and the green luminescent layer 27 so as to be flattened.

No particular limitation is imposed upon the forming method for the blue luminescent layer 28, and it is possible to form the layer using the general film forming method known as deposition method or wet method, for instance, or using the ink-jet method.

Further, the blue luminescent layer 28 can be formed of an electron injection and transfer material such as aluminum quinolynol complex. In this case, it is possible to promote the injection and transfer of the carriers so as to improve the luminous efficiency. Furthermore, when such a blue luminescent layer 28 is laminated with red and green luminescent layers formed of a hole injection and transfer material, it is also possible to inject and transfer the electrons and the holes from the respective electrodes into these laminated luminescent layers with appropriate balance, thereby enabling to improve the luminous efficiency.

In the illustrated embodiment, organic luminescent layers for two colors are formed by the ink-jet method while the layer for the remaining one color is formed by a different method. Therefore, according to this embodiment, even when a luminescent material which is not so suited for the ink-jet method is used, a full color organic EL element can be formed by using such a material in a combination with other organic luminescent materials that are suited for the ink-jet method, so that the latitude in the design for the EL element will be expanded. Of course, if desired, all the luminescent layers may be formed by the ink-jet method.

Figure 8F:
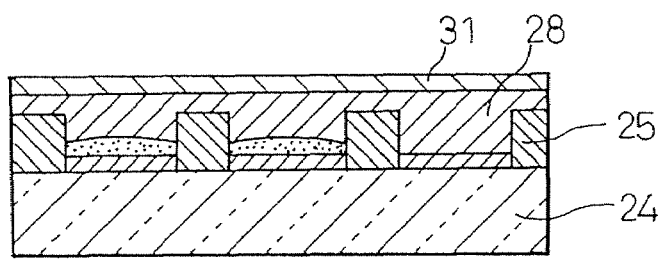

Finally, as is shown in FIG. 8F, a cathode (a counter electrode) 31 is formed, thereby the organic EL element of the present invention is completed. In this case, it is preferred that the cathode 31 is formed into a metallic thin film electrode, and as for examples of the metal for forming the cathode, Mg, Ag, Al, Li and the like can be mentioned. In addition, a material having small work function can be used for the material for the cathode 31, and for example, alkali metal, alkali earth metal such as Ca and the like, and alloys containing these metals can be used. Such a cathode 31 may be formed using a deposition method, a sputtering method or the like.

Figure 8G:
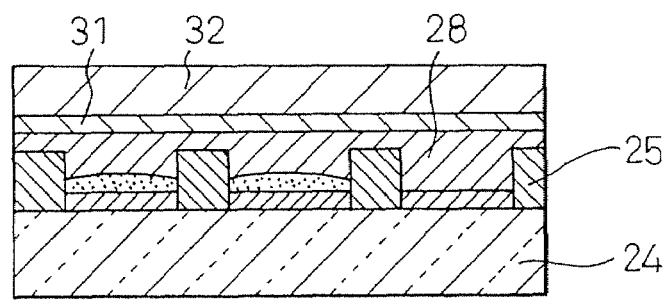

Further, as shown in FIG. 8G, a protective film 32 may be formed on top of a cathode 31. By forming such a protective film 32, it becomes possible to prevent deterioration, damage, peeling and the like from occurring in the cathode 31 and in the luminescent layers 26, 27 and 28. As for materials for constructing the protective film 32, epoxy resin, acrylic resin, liquid glass and the like can be mentioned. Further, as for examples of the forming method for the protective film 32, spin coating method, casting method, dipping method, bar coating method, roll coating method, capillary method and the like can be mentioned.

In this embodiment, it is preferable that the luminescent layers are formed of an organic compound, and it is more preferable that these luminescent layers are formed of a polymer organic compound. By providing such luminescent layers that are formed of the organic compound, it is possible to obtain high brightness surface luminescence at low voltages. Further, since luminescent materials can be selected from wide range of field, a rational design for the luminescent element becomes possible. In particular, polymer organic compounds have an excellent film formation property, and the luminescent layers composed of polymer organic compounds have an extremely good durability. Further, these polymer organic compounds have a band gap in the visible region and a relatively high electrical conductivity. Among such polymer organic compounds, a conjugated polymer can exhibit such properties prominently.

As for materials for the organic luminescent layers, polymer organic compound itself, precursor of conjugated organic polymer compound which is to be conjugated (to form a film) by heating or the like, and other materials are used.

In the above descriptions referring to the attached drawings, use of the donor sheet of the present invention in the formation of the separation ribs of the color filter, black matrix of the liquid crystal display device and partitioning walls of the organic EL element according to the LITI method was explained in detail, however, it should be noted that the donor sheet of the present invention can be advantageously applied to the formation of other separation members. In particular, the donor sheet of the present invention is noticeable, because it can be used to form separation members for all the materials capable of being patterned in accordance with the ink-jet method.

EXAMPLES

The present invention will be described by way of the examples thereof. It is appreciated that the present invention is not limited to the following examples.

Example 1

(1) Production of Donor Sheet

A donor sheet comprising a base, a light-to-heat conversion layer, an intermediate layer and a transfer layer, said layers being formed on the base, was produced according to the following procedure.

After a polyethylene terephthalate (PET) film having a thickness of 75 μm was prepared as a base, a light-to-heat conversion layer (LTHC layer), an intermediate layer and a transfer layer each having the following composition and film thickness were formed in the order as described below. The (LTHC layer) and the intermediate layer were coated with die coating method, followed by being cured by irradiation with ultraviolet rays, and then the transfer layer was similarly formed with die coating method.

| Light-to-heat conversion layer | |
|---|---|
| Carbon black (trade name: "Raben 760", manufactured by Colombian Carbon Co.) | 100.0% by weight |
| Dispersant (trade name: "Disperbyk 161", manufactured by BYK-Cheimie Co.) | 8.9% by weight |

-continued

| | |
|---|---|
| Vinyl butyral resin (trade name: "Burvar B-98", manufactured by Nippon Monsanto Co.) | 17.9% by weight |
| Carboxyl group-containing acrylic resin (trade name: "Joncryi 67", manufactured by Jonson Polymer Co.) | 53.5% by weight |
| Acrylic oligomer (trade name: "Evecryl EB629", manufactured by UCB Radcure Co.) | 834.0% by weight |
| Carboxyl group-containing acrylic resin (trade name: "Elvacite 2669", manufactured by ICI Co.) | 556.0% by weight |
| Photopolymerization initiator (trade name: "Irgacure 369", manufactured by Ciba Geigy Co.) | 45.2% by weight |
| Photopolymerization initiator (trade name: "Irgacure 184", manufactured by Ciba Geigy Co.) | 6.7% by weight |
| Total | 1622.3% by weight |

Solid content: 30% in PMA:MEK = 60:40
Film thickness: 5 μm

Intermediate layer

| | |
|---|---|
| Vinyl butyral resin (trade name: "Burvar B-98", manufactured by Nippon Monsanto Co.) | 4.76% by weight |
| Carboxyl group-containing acrylic resin (trade name: "Joncryi 67", manufactured by Jonson Polymer Co.) | 14.29% by weight |
| Acrylic monomer (trade name: "Sartomer 351", manufactured by Sartomer Co.) | 79.45% by weight |
| Photopolymerization initiator (trade name: "Irgacure 369", manufactured by Ciba Geigy Co.) | 4.50% by weight |
| Fluorescent dye | 1.12% by weight |
| Total | 104.12% by weight |

Solid content: 9.3% in IPA:MEK = 90:10
Film thickness: 1 μm

Transfer layer

| | |
|---|---|
| Pigment, Dioxane Violet (trade name: "Hostaperum Violet RL NF", manufactured by BASF Co.) | 50.0% by weight |
| Pigment, Disazoyellow (trade name: "ECY-204", manufactured by Dainippon Seika Industries Co.) | 50.0% by weight |
| Dispersant (trade name: "Disperbyk 161", manufactured by BYK-Cheimie Co.) | 15.0% by weight |
| Carboxyl group-containing acrylic resin (trade name: "CARBOSET GA1162", manufactured by B.F. Goodrich Co.) | 268.8% by weight |
| Fluororesin (trade name: "FC55/35/10", manufactured by 3M Co.) | 0.05% by weight |
| Epoxy crosslinking agent (trade name: "SU8", manufactured by Shell Chemical Co.) | 111.1% by weight |
| Total | 497.44% by weight |

Solid content: 13.5% in PMA:MIBK:BC = 60:30:10
BC = butylcellosolve
Film thickness: 2.0 μm (2) Production of Black Matrix Using an exclusive LITI machine (laser beam thermal transfer machine, wavelength of laser beam: 1064 nm), a black matrix was produced on a glass substrate. The donor sheet produced in the previous step and the glass substrate were laid one upon another, and then laser beam was irradiated in a striped form under the conditions of an output of 11 W, a scan speed of 15 m/s and an irradiation width of 20 μm. Then, baking was conducted in an oven at 230° C. for 1 hour so as to cure and make the transfer portion come closely into contact. As a result, a black matrix having a width of 20 μm and a thickness of 2.0 μm was formed on the glass substrate.

[Evaluation Test]

Determination of contact angle and critical surface tension:

To evaluate an ink repellency of the black matrix (partition pattern) produced in accordance with the above-described process, a contact angle of the pattern with ink was determined. The contact angle was 65° as shown in the following Table 1. Further, a critical surface tension was calculated from the contact angles with different solvents in each of the opening area, surrounded by the partition pattern, and the pattern area. As is shown in the following Table 1, the critical surface tension was 55 dyne/cm in the opening area, and
33 dyne/cm in the pattern area.

Note that a water-based color ink (red, green and blue; surface tension 45 dyne/cm) was used in the above determination.

Determination of color mixture and color spot in the color filter:

Using the glass substrate with black matrix (partition pattern) produced in accordance with the above-described process, a color filter was produced to evaluate color mixture and color spot in each picture element area of the filter.

Using the ink jet printing device, water-based color ink (red, green and blue) was poured into each of the opening areas on the glass substrate having the previously produced partition patter to form red, green and blue colored areas, followed by drying at 200° C. for 10 minutes. In each of the thus produced red, green and blue picture element areas, presence or absence of color mixture and color spot was observed by using an optical microscope and a microscopic spectrometer. The presence or absence of color mixture was evaluated from the migration of ink into the adjacent picture element area. With regard to the color spot, samples where no color spot was observed were rated "good (&)", samples where color spot was slightly observed, but permissible were rate "fair (■)", and samples where severe color spot was observed were rated "bad (x)". For the samples showing color mixture, the observation of the color spot was omitted. As is shown in the following Table 1, no color mixture observed and the color spot was rated "fair" in this example.

Example 2

The procedure of Example 1 was repeated with the proviso that, in this example, a glass substrate with chromium (Cr) black matrix (hereinafter, referred to as "CrBM") was used in place of the glass substrate, and a separation rib was produced on the black matrix of the substrate in accordance with the following method.

Using an exclusive LITI machine (laser beam thermal transfer machine, wavelength of laser beam: 1064 nm), a separation rib was laid on a glass substrate provided with a black matrix. The donor sheet produced in Example 1 was laid on the black matrix side of the glass substrate, and then laser beam was irradiated from the side of the donor sheet in the same striped pattern as that of the black matrix under the conditions of an output of 11 W, a scan speed of 15 m/s and an irradiation width of 20 μm. Then, baking was conducted in an oven at 230° C. for 1 hour so as to cure and adhere the transferred portion. A separation rib having a width of 20 μm and a thickness of 2.0 μm was formed on the black matrix of the glass substrate.

The evaluation test similar to that of Example 1 was carried out using the resulting glass substrate with the partition pattern (black matrix plus separation rib). As shown in the following Table 1, the contact angle between the ink and the pattern was 65°, the critical surface tension of the pattern was 33 dyne/cm, no color mixture was observed, and the color spot was rated "fair".

Comparative Example 1

The procedure of Example 1 was repeated with the proviso that, in this example, for the comparison purpose, a solvent-based color ink (red, green and blue; surface tension 30 dyne/cm) was used in place of the water-based ink.

The evaluation test similar to that of Example 1 was carried out using the resulting glass substrate with the partition pattern (black matrix). As shown in the following Table 1, the contact angle was 7°, the critical surface tension was 33 dyne/cm, and color mixture was observed.

Comparative Example 2

The procedure of Example 1 was repeated with the proviso that, in this example, for the comparison purpose, an amount of the fluororesin (trade name "FC55/35/10", available from 3M Co.) added to the transfer layer was changed from 0.05% by weight to 0.51% by weight.

The evaluation test similar to that of Example 1 was carried out using the resulting glass substrate with the partition pattern (black matrix). As shown in the following Table 1, the contact angle was 88°, the critical surface tension was 27 dyne/cm, no color mixture was observed, but the picture element had a convexity, and the color spot was rated "bad".

Comparative Example 3

The procedure of Example 1 was repeated with the proviso that, in this example, for the comparison purpose, a solvent-based color ink was used as in Comparative Example 1, and an amount of the fluororesin added was changed to 0.51% by weight as in Comparative Example 2.

The evaluation test similar to that of Example 1 was carried out using the resulting glass substrate with the partition pattern (black matrix). As shown in the following Table 1, the contact angle was 30°, the critical surface tension was 27 dyne/cm, and color mixture was observed.

Example 3

The procedure of Example 1 was repeated with the proviso that, in this example, a solvent-based color ink was used as in Comparative Example 1, and an amount of the fluororesin added was changed from 0.05% by weight to 7.62% by weight.

The evaluation test similar to that of Example 1 was carried out using the resulting glass substrate with the partition pattern (black matrix). As shown in the following Table 1, the contact angle was 45°, the critical surface tension was 20 dyne/cm, no color mixture was observed, and the color spot was rated "good".

Example 4

The procedure of Example 2 was repeated with the proviso that, in this example, a solvent-based color ink was used as in Comparative Example 1, and an amount of the fluororesin added was changed from 0.05% by weight to 7.62% by weight.

The evaluation test similar to that of Example 1 was carried out using the resulting glass substrate with the partition pattern (black matrix plus separation rib). As shown in the following Table 1, the contact angle was 45°, the critical surface tension was 20 dyne/cm, no color mixture was observed, and the color spot was rated "good".

Example 5

The procedure of Example 3 was repeated with the proviso that, in this example, a thickness of the baked transfer layer (that is, a height of pattern) was changed from 2 μm to 1.6 μm.

The evaluation test similar to that of Example 1 was carried out using the resulting glass substrate with the partition pattern (black matrix). As shown in the following Table 1, the contact angle was 45°, the critical surface tension was 20 dyne/cm, no color mixture was observed, and the color spot was rated "good".

Comparative Example 4

The procedure of Example 3 was repeated with the proviso that, in this example, for the comparison purpose, a thickness of the baked transfer layer (that is, a height of pattern) was changed from 2 μm to 0.9 μm.

The evaluation test similar to that of Example 1 was carried out using the resulting glass substrate with the partition pattern (black matrix). As shown in the following Table 1, the contact angle was 45°, the critical surface tension was 20 dyne/cm, and color mixture was observed.

Example 6

The procedure of Example 1 was repeated with the proviso that, in this example, a solvent-based color ink was used as in Comparative Example 1, and an amount of the fluororesin added was changed from 0.05% by weight to 10.16% by weight.

The evaluation test similar to that of Example 1 was carried out using the resulting glass substrate with the partition pattern (black matrix). As shown in the following Table 1, the contact angle was 50°, the critical surface tension was 18 dyne/cm, no color mixture was observed, and the color spot was rated "good".

Comparative Example 5

The procedure of Example 1 was repeated with the proviso that, in this example, for the comparison purpose, a solvent-based color ink was used as in Comparative Example 1, and an amount of the fluororesin added was changed from 0.05% by weight to 55.00% by weight.

The evaluation test similar to that of Example 1 was carried out using the resulting glass substrate with the partition pattern (black matrix). As shown in the following Table 1, the contact angle was 60°, the critical surface tension was 15 dyne/cm, no color mixture was observed, but the picture element had a convexity, and the color spot was rated "bad".

Example 7

The procedure of Example 3 was repeated with the proviso that, in this example, the BM substrate was used as in Example 2, in place of the glass substrate. The evaluation test similar to that of Example 1 was carried out using the resulting glass substrate with the partition pattern (black matrix). As shown in the following Table 1, the contact angle was 45°, and the critical surface tension was 20 dyne/cm.

As is seen from the results described in Table 1, according to the present invention, a black matrix or separation rib suited for producing a color filter by an ink-jet recording method can be produced in a simple technique. Furthermore, suitable ink repellency can be obtained by controlling an amount of a fluororesin to be contained in an image component of a transfer layer. Further, in the resulting color filters, the generation of color mixture and color spot can be effectively prevented.

INDUSTRIAL APPLICABILITY

As described above, according the present invention, there can be provided a donor sheet, which can produce an separation member of an optical element, e.g. partition pattern of a color filter, black matrix of a liquid crystal display device, and partitioning wall of the organic EL element by a shortened manufacturing step with ease and accuracy at high contrast, and can impart excellent ink repellency, i.e. water repellency and oil repellency to the separation member. Use of this donor sheet has an effect capable of producing a color filter, a liquid crystal display device, organic EL element and other optical elements at low cost by a simple technique. It should be particularly noted that, on providing such an optical element with a separation member, the substrate separation member can be provided by directly writing onto the substrate without using a complex method such as lithography method, like the prior art. The separation member of the optical element thus obtained, such as partition pattern, separation rib, black matrix, partitioning wall or the like, is suited for formation of picture elements according to an ink-jet recording method because it is particularly superior in ink repellency (water repellency and oil repellency). Furthermore, since the amount of a fluorine-containing compound and/or a silicone compound contained in the transfer layer of the donor sheet is optimized in the present invention, there is also exerted an effect capable of controlling the water repellency and oil repellency of the separation member with maintaining the adhesion of the image component (separation member) to be transferred to the image receiving element.

The invention claimed is:
1. A method of producing a color filter comprising a transparent substrate, a plurality of picture elements disposed on a

TABLE 1

| Example No. | Ink[1] | Substrate | Pattern Height (μm) | Contact angle[2] (°) | Critical surface tension[3] (dyne/cm) Opening area | Critical surface tension[3] (dyne/cm) Pattern area | Color mixture | Color spot[4] |
|---|---|---|---|---|---|---|---|---|
| Example 1 | b) | Glass | 2 | 65 | 55 | 33 | None | ■ |
| Example 2 | b) | CrBM | 2 | 65 | 55 | 33 | None | ■ |
| Comp. Ex. 1 | a) | Glass | 2 | 7 | 55 | 33 | Observed | — |
| Comp. Ex. 2 | b) | Glass | 2 | 88 | 55 | 27 | None | X |
| Comp. Ex. 3 | a) | Glass | 2 | 30 | 55 | 27 | Observed | — |
| Example 3 | a) | Glass | 2 | 45 | 55 | 20 | None | ☆ |
| Example 4 | a) | CrBM | 2 | 45 | 55 | 20 | None | ☆ |
| Example 5 | a) | Glass | 1.6 | 45 | 55 | 20 | None | ☆ |
| Comp. Ex. 4 | a) | Glass | 0.9 | 45 | 55 | 20 | Observed | — |
| Example 6 | a) | Glass | 2 | 50 | 55 | 18 | None | ☆ |
| Comp. Ex. 5 | a) | Glass | 2 | 60 | 55 | 15 | None | X |
| Example 7 | a) | BM | 2 | 45 | 55 | 20 | — | — |

[1]a) Solvent-based ink (surface tension 30 dyne/cm); b) water-based ink (surface tension 40 dyne/cm)
[2]Contact angle of pattern with ink
[3]Determined from contact angle with different solvents
[4]☆: good; ■: fair; X: bad predetermined position of the substrate, and a partition pattern for separating adjacent picture elements, which comprises the steps of:

forming a thin film-like black matrix in a predetermined pattern on the surface of the substrate;

making the surface of the black matrix side of the substrate and a transfer layer of a donor sheet comprising a base, a light-to-heat conversion layer, and the transfer layer containing an image component which is melted by heating due to an action of the light-to-heat conversion layer and transferred to the substrate in a patterned form, said layers being formed in order on the base, come closely into contact with each other;

irradiating laser beam from the base side of the donor sheet corresponding to the pattern of the black matrix by a thermal image process using laser beam, thereby to melt the image component of the transfer layer of the donor sheet with heating and to pile up the molten image component on the black matrix; and filling an opening portion surrounded by the formed partition pattern with ink having a predetermined color using an ink-jet method.

2. The method according to claim 1, wherein the donor sheet transfers an imaging pattern to an image receiving element by a thermal imaging process using laser beam, comprising a base, a light-to-heat conversion layer, and a transfer layer containing an image component which is melted by heating due to an action of the light-to-heat conversion layers and transferred to the image receiving element in a patterned form, said layers being formed in order on the base, characterized in that:

the image component of the transfer layer contains an ink-repellent or solvent-repellent compound in an optimized amount.

3. A method of producing a color filter comprising a transparent substrate, a plurality of picture elements disposed on a predetermined position of the substrate, and a partition pattern for separating adjacent picture elements, which comprises the steps of:

coating the surface of the substrate to form a thin film of a black matrix forming material;

laying the substrate and a donor sheet comprising a base, a light-to-heat conversion layer, and a transfer layer containing an image component which is melted by heating due to an action of the light-to-heat conversion layer and transferred to the substrate in a patterned form, said layers being formed in order on the base, one upon another so that the thin film-like black matrix forming material and the transfer layer of the donor sheet come closely into contact with each other;

irradiating laser beam from the base side of the donor sheet corresponding to a desired pattern of the black matrix by a thermal image process using laser beam, thereby to melt the image component of the transfer layer of the donor sheet with heating and to transfer the melted image component on the thin film-like black matrix forming material;

removing the exposed black matrix forming material by etching using, as a mask, the image component transferred to the surface of the thin film-like black matrix forming material of the substrate in a patterned form; and filling an opening portion surrounded by the partition pattern formed from the image component and black matrix as a ground thereof with ink having a predetermined color using an ink-jet method, thereby to form picture elements.

4. The method according to claim 3, wherein the donor sheet transfers an imaging pattern to an image receiving element by a thermal imaging process using laser beam, comprising a base, a light-to-heat conversion layer, and a transfer layer containing an image component which is melted by heating due to an action of the light-to-heat conversion layers and transferred to the image receiving element in a patterned form, said layers being formed in order on the base, characterized in that:

the image component of the transfer layer contains an ink-repellent or solvent-repellent compound in an optimized amount.

* * * * *